(12) United States Patent
Kaneko

(10) Patent No.: US 12,191,116 B2
(45) Date of Patent: Jan. 7, 2025

(54) PLASMA PROCESSING APPARATUS AND PLASMA PROCESSING METHOD

(71) Applicant: TOKYO ELECTRON LIMITED, Tokyo (JP)

(72) Inventor: Kazushi Kaneko, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 379 days.

(21) Appl. No.: 17/497,559

(22) Filed: Oct. 8, 2021

(65) Prior Publication Data

US 2022/0115208 A1 Apr. 14, 2022

(30) Foreign Application Priority Data

Oct. 8, 2020 (JP) .................................. 2020-170750

(51) Int. Cl.
*H01J 37/32* (2006.01)

(52) U.S. Cl.
CPC .. *H01J 37/32165* (2013.01); *H01J 37/32174* (2013.01); *H01J 37/3244* (2013.01); *H01J 2237/334* (2013.01)

(58) Field of Classification Search
CPC .......... H01J 37/32174; H01J 37/32165; H01J 37/3244; H01J 2237/334
See application file for complete search history.

(56) References Cited

U.S. PATENT DOCUMENTS

| 2019/0057843 A1* | 2/2019 | Kaneko | ............ H01J 37/32082 |
| 2019/0244789 A1* | 8/2019 | Kaneko | ............ H01J 37/32266 |

FOREIGN PATENT DOCUMENTS

| JP | 3122618 B2 | 10/2000 |
| JP | 2020-071912 A | 5/2020 |

* cited by examiner

*Primary Examiner* — Yuechuan Yu
(74) *Attorney, Agent, or Firm* — XSENSUS LLP

(57) ABSTRACT

A plasma processing apparatus includes a processing chamber configured to accommodate a substrate, a gas supply configured to supply a processing gas into the processing chamber, a power supply configured to supply power to the processing chamber to generate plasma such that the substrate is processed by using the generated plasma, and a control device configured to control the power supply. The control device controls the power supply to perform a process of supplying a first power including a frequency component within a first band having a first bandwidth to the processing chamber when the plasma is generated from the processing gas, and a process of supplying a second power including a frequency component within a second band having a second bandwidth smaller than or equal to the first bandwidth to the processing chamber when the substrate is processed by using the generated plasma.

12 Claims, 12 Drawing Sheets

PLASMA PROCESSING APPARATUS AND PLASMA PROCESSING METHOD

CROSS-REFERENCE TO RELATED APPLICATIONS

This application claims priority to Japanese Patent Application No. 2020-170750, filed on Oct. 8, 2020, the entire contents of which are incorporated herein by reference.

TECHNICAL FIELD

Various aspects and embodiments of the present disclosure relate to a plasma processing apparatus and a plasma processing method.

BACKGROUND

A manufacturing process of a device includes a process of performing processing using plasma. In the processing using plasma, since power of a predetermined frequency is supplied into a processing chamber, plasma is generated from a processing gas supplied into the processing chamber, and plasma processing such as etching is performed on a substrate by the generated plasma.

However, resonance conditions in the processing chamber are different in a state in which plasma is present in the processing chamber and a state in which plasma is not present in the processing chamber. Accordingly, when the frequency of the power supplied into the processing chamber is selected according to the resonance condition in a normal state in which plasma is present in the processing chamber, there is a case in which the plasma is not generated in the processing chamber.

In order to avoid this, a technique for shifting the frequency of the power supplied into the processing chamber when the plasma is generated to a frequency relatively higher than the frequency in the normal state in which the plasma is excited is known (see, for example, Japanese Patent Publication No. 3122618).

SUMMARY

The present disclosure is directed providing a plasma processing apparatus capable of stably maintaining plasma while more reliably generating plasma and a plasma processing method.

One aspect of the present disclosure provides a plasma processing apparatus comprising a processing chamber configured to accommodate a substrate, a gas supply configured to supply a processing gas into the processing chamber, a power supply configured to supply power to the processing chamber to generate plasma from the processing gas supplied into the processing chamber such that the substrate is processed by using the generated plasma, and a control device configured to control the power supply. The control device controls the power supply to perform (a) a process of supplying a first power including a frequency component within a first band having a first bandwidth to the processing chamber when the plasma is generated from the processing gas, and (b) a process of supplying a second power including a frequency component within a second band having a second bandwidth to the processing chamber when the substrate is processed by using the generated plasma. The second bandwidth is smaller than or equal to the first bandwidth.

DETAILED DESCRIPTION

Hereinafter, embodiments of a plasma processing apparatus and a plasma processing method to be disclosed will be described in detail based on the accompanying drawings. Further, the plasma processing apparatus and the plasma processing method to be disclosed are not limited by the following embodiments.

However, a resonance condition in a processing chamber is affected by various factors such as a shape, a size, and a position of a component in the processing chamber, a type of processing gas, and a pressure in the processing chamber. Further, a dimensional error, an assembly error, and the like are included in the shape and position of the component in the processing chamber. In addition, when plasma processing is performed several times in the processing chamber, an amount of deposit attached to the component in the processing chamber, a consumption amount of the components, or the like changes. Accordingly, the resonance condition in the processing chamber changes depending on an environment in the processing chamber.

Accordingly, even when a frequency of power corresponding to the resonance condition is determined based on a design value, the determined frequency of the resonance condition and a frequency of the resonance condition in actual processing may deviate. When a frequency of the power supplied into the processing chamber is different from the frequency of the resonance condition, since sufficient power is not supplied into the processing chamber, it is difficult to generate plasma. Accordingly, it is conceivable to supply power including a frequency component of a bandwidth including the frequency of the resonance condition in the actual processing.

Here, once the plasma is generated, impedance matching of the output impedance of a power supply and load impedance including the processing chamber and the plasma is continuously performed in order to maintain the generated plasma. In this case, when the bandwidth of the power supplied into the processing chamber is wide or when the center frequency is shifted in the same bandwidth, since the impedance matching point shifts when the plasma starts to be generated, and thus the reflected waves increase, it becomes difficult to perform the impedance matching with high precision.

Accordingly, in the present disclosure, a technology capable of stably maintaining the plasma while more reliably generating the plasma is provided.

First Embodiment

[Configuration of a Plasma Processing Apparatus 1]

Figure 1:
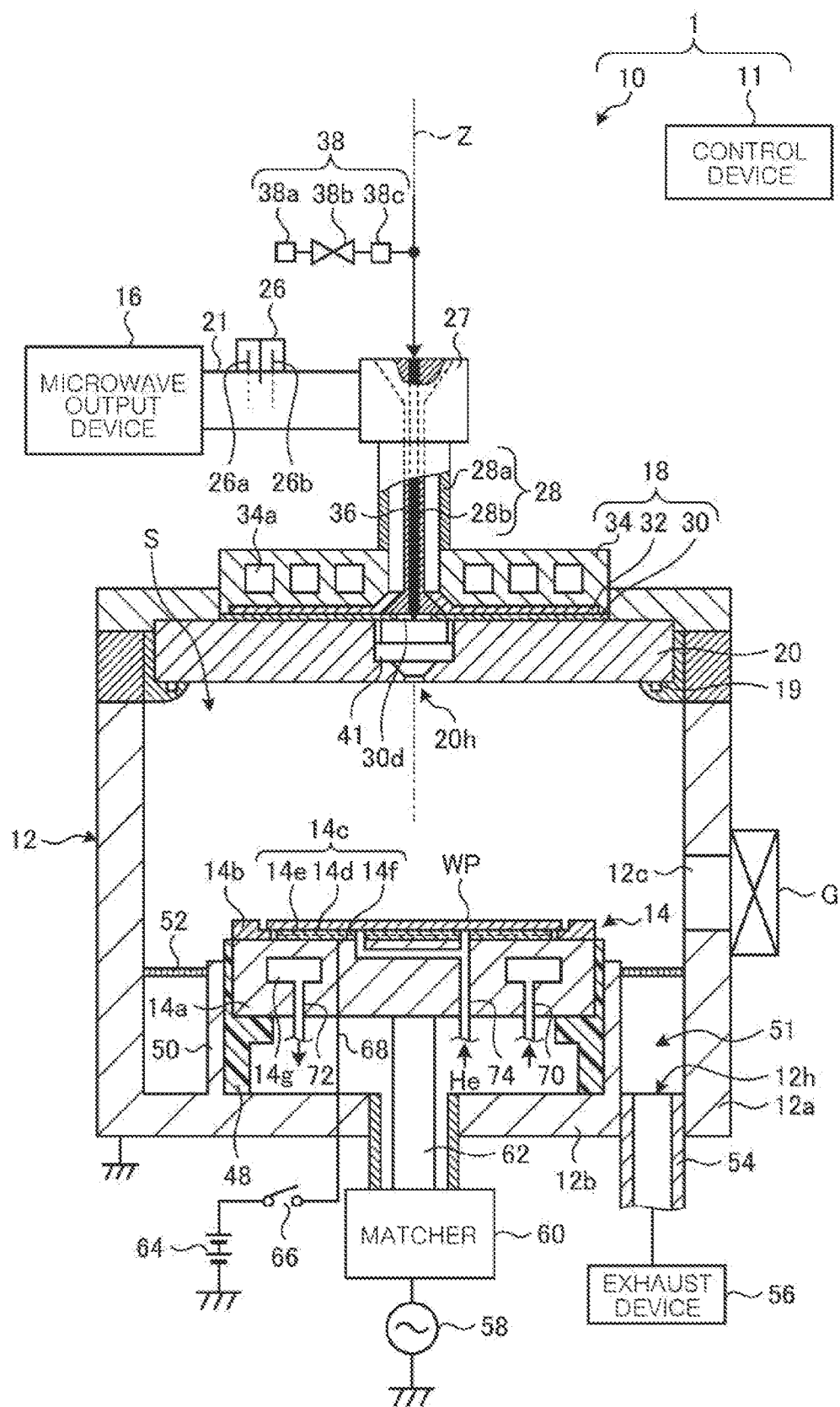
FIG. 1 is a schematic cross-sectional view illustrating one example of a plasma processing apparatus according to one embodiment of the present disclosure.

FIG. 1 is a schematic cross-sectional view illustrating one example of the plasma processing apparatus 1 according to one embodiment of the present disclosure. The plasma processing apparatus 1 includes a device main body 10 and a control device 11. The device main body 10 includes a processing chamber 12 and a microwave output device 16.

The processing chamber 12 has a surface formed in a substantially cylindrical shape with, for example, anodized aluminum or the like, and a substantially cylindrical processing space S is provided therein. The processing chamber 12 is securely grounded. Further, the processing chamber 12 has a sidewall 12a and a lower portion 12b. A central axis line of the sidewall 12a is defined as an axis line Z. The lower portion 12b is provided at a lower end side of the sidewall 12a. An exhaust port 12h for exhaust is formed in the lower portion 12b. Further, an upper end portion of the sidewall 12a is open.

An opening 12c for carrying in and carrying out a substrate WP is formed in the sidewall 12a. The opening 12c is opened and closed by a gate valve G.

A dielectric window 20 is provided in the upper end portion of the sidewall 12a, and the dielectric window 20 closes the opening of the upper end of the sidewall 12a from above. A lower surface of the dielectric window 20 faces the processing space S. A sealing member 19 such as an O-ring is disposed between the dielectric window 20 and the upper end portion of the sidewall 12a.

In the processing chamber 12, a stage 14 is provided. The stage 14 is provided so as to face the dielectric window 20 in the direction of the axis line Z. A space between the stage 14 and the dielectric window 20 is the processing space S. The substrate is WP mounted on the stage 14.

The stage 14 has a base 14a and an electrostatic chuck 14c. The base 14a is formed in a substantially disk shape with a conductive material such as aluminum. The base 14a is disposed in the processing chamber 12 so that a central axis line of the base 14a substantially coincides with the axis line Z.

The base 14a is formed of an insulating material and is supported by a cylindrical support 48 extending in the direction of the axis line Z. A conductive cylindrical support 50 is provided on an outer circumference of the cylindrical support 48. The cylindrical support 50 extends from the lower portion 12b of the processing chamber 12 toward the dielectric window 20 along the outer circumference of the cylindrical support 48. A ring-shaped exhaust path 51 is formed between the cylindrical support 50 and the sidewall 12a.

A ring-shaped baffle plate 52 formed with a plurality of through holes in a thickness direction is provided on the exhaust path 51. The exhaust port 12h is provided under the baffle plate 52. An exhaust device 56 having a vacuum pump such as a turbo molecular pump or the like, an automatic pressure control valve, or the like is connected to the exhaust port 12h through an exhaust pipe 54. With the exhaust device 56, the processing space S may be decompressed to a predetermined degree of vacuum.

The base 14a functions as a radio frequency (RF) electrode. An RF power source 58 for RF bias is electrically connected to the base 14a through a power supply rod 62 and a matcher 60. The RF power source 58 supplies bias power of a frequency suitable for controlling the energy of ions entering the substrate WP (for example, 13.56 MHz) to the base 14a through the matcher 60 and the power supply rod 62.

The matcher 60 accommodates a matching device for matching between the impedance of the RF power source 58 and the impedance of a load, such as an electrode, plasma, the processing chamber 12, or the like. A blocking capacitor for self-bias generation is included in the matching device.

The electrostatic chuck 14c is provided on an upper surface of the base 14a. The electrostatic chuck 14c is disposed on the upper surface of the base 14a so that a central axis line of the electrostatic chuck 14c substantially coincides with the axis line Z. The electrostatic chuck 14c adsorbs and holds the substrate WP by an electrostatic force. The electrostatic chuck 14c has a substantially disk-shaped outer shape, and includes an electrode 14d, an insulating film 14e, and an insulating film 14f. The electrode 14d of the electrostatic chuck 14c is made of a conductive film, and is provided between the insulating films 14e and 14f. A direct current (DC) power supply 64 is electrically connected to the electrode 14d through a covered wire 68 and a switch 66. The electrostatic chuck 14c may adsorb and hold the substrate WP on the upper surface thereof by an electrostatic force generated by a DC voltage applied from the DC power supply 64. Further, an edge ring 14b is provided on the base 14a. The edge ring 14b is disposed to surround the substrate WP and the electrostatic chuck 14c. The edge ring 14b may also be called as a focus ring.

A flow path 14g is formed in the base 14a. A refrigerant is supplied to the flow path 14g from a chiller unit (not shown) through a pipe 70. The refrigerant supplied to the flow path 14g is returned to the chiller unit through a pipe 72. Since the refrigerant of which a temperature is controlled by the chiller unit circulates in the flow path 14g of the base 14a, a temperature of the base 14a is controlled. Since the temperature of the base 14a is controlled, a temperature of the substrate WP on the electrostatic chuck 14c is controlled through the electrostatic chuck 14c on the base 14a.

Further, the stage 14 is provided with a pipe 74 for supplying a heat transfer gas such as He gas or the like between the electrostatic chuck 14c and the substrate WP.

The microwave output device 16 outputs microwaves for exciting the processing gas supplied into the processing chamber 12. The microwave output device 16 is an example of a power supply. The microwave output device 16 may adjust a bandwidth and a center frequency of the microwaves, and magnitude of the power. The microwave output device 16 may adjust the bandwidth and center frequency of the microwaves within a frequency range of, for example, 2.4 GHz to 2.5 GHz.

Further, the device main body 10 includes a waveguide 21, a tuner 26, a mode converter 27, and a coaxial waveguide 28. An output part of the microwave output device 16 is connected to one end of the waveguide 21. The other end of the waveguide 21 is connected to the mode converter 27. The waveguide 21 is, for example, a rectangular waveguide. The waveguide 21 is provided with the tuner 26. The tuner 26 has a movable plate 26a and a movable plate 26b. Since a protruding amount of each of the movable plates 26a and 26b may be adjusted with respect to an inner space of the waveguide 21, the output impedance of the microwave output device 16 and the impedance of the load may be matched.

The mode converter 27 converts a mode of the microwaves output from the waveguide 21 and supplies the microwaves after mode conversion to the coaxial waveguide 28. The coaxial waveguide 28 propagates the microwaves of which the mode is converted by the mode converter 27 to an antenna 18. The coaxial waveguide 28 includes an outer conductor 28a and an inner conductor 28b. The outer conductor 28a and the inner conductor 28b each have a substantially cylindrical shape. The outer conductor 28a and the inner conductor 28b are disposed above the antenna 18 so that central axis lines of the outer conductor 28a and the inner conductor 28b substantially coincide with the axis line Z.

The antenna 18 supplies the microwaves into the processing chamber 12. The antenna 18 is provided on an upper surface of the dielectric window 20. The antenna 18 includes a slot plate 30, a dielectric plate 32, and a cooling jacket 34. The slot plate 30 is formed in a substantially disk shape with a metal having conductivity. The slot plate 30 is provided on the upper surface of the dielectric window 20 so that a central axis line of the slot plate 30 coincides with the axis line Z. A plurality of slot holes are formed in the slot plate 30. The plurality of slot holes constitute, for example, a plurality of slot pairs. Each of the plurality of slot pairs includes two slot holes in a shape of elongated holes extending in directions crossing each other. The plurality of slot pairs are arranged along one or more concentric circles around the central axis line of the slot plate 30. Further, in a center portion of the slot plate 30, a through hole 30d through which a conduit 36 to be described later may pass is formed.

The dielectric plate 32 is formed in a substantially disk shape with a dielectric material such as quartz or the like. The dielectric plate 32 is provided on the slot plate 30 so that a central axis line of the dielectric plate 32 substantially coincides with the axis line Z. The cooling jacket 34 is provided on the dielectric plate 32. The dielectric plate 32 is provided between the cooling jacket 34 and the slot plate 30.

A surface of the cooling jacket 34 has conductivity. A flow path 34a is formed in the cooling jacket 34. A refrigerant is supplied to the flow path 34a from a chiller unit (not shown). A lower end of the outer conductor 28a is electrically connected to an upper surface of the cooling jacket 34. Further, the lower end of the inner conductor 28b is electrically connected to the slot plate 30 through an opening formed in center portions of the cooling jacket 34 and the dielectric plate 32.

The microwaves which propagated in the coaxial waveguide 28 propagate in the dielectric plate 32 propagate from the plurality of slot holes in the slot plate 30 to the dielectric window 20. The microwaves which propagated to the dielectric window 20 are radiated into the processing space S from the lower surface of the dielectric window 20.

The conduit 36 is provided in the inner conductor 28b of the coaxial waveguide 28. The through hole 30d through which the conduit 36 may pass is formed in the center portion of the slot plate 30. The conduit 36 extends through an inner side of the inner conductor 28b and is connected to a gas supply 38.

The gas supply 38 supplies the processing gas for processing the substrate WP to the conduit 36. The gas supply 38 includes a gas supply source 38a, a valve 38b, and a flow rate controller 38c. The gas supply source 38a is a supply source of the processing gas. The valve 38b controls supply and stoppage of supply of the processing gas from the gas supply source 38a. The flow rate controller 38c is, for example, a mass flow controller or the like, and controls a flow rate of the processing gas supplied from the gas supply source 38a to the conduit 36.

The dielectric window 20 is provided with an injector 41. The injector 41 supplies the gas from the conduit 36 to a through hole 20h formed in the dielectric window 20. The gas supplied to the through hole 20h of the dielectric window 20 is injected into the processing space S, and excited by the microwaves radiated into the processing space S from the dielectric window 20. Accordingly, the processing gas is converted to plasma in the processing space S, and the substrate WP on the electrostatic chuck 14c is processed by ions and radicals included in the plasma.

The control device 11 has a processor, a memory, and an input/output interface. The memory stores a program, a process recipe, and the like. The processor generally controls each part of the device main body 10 through the input/output interface based on the process recipe stored in the memory by reading and executing the program from the memory.

[Detailed Description of the Microwave Output Device 16]

Figure 2:
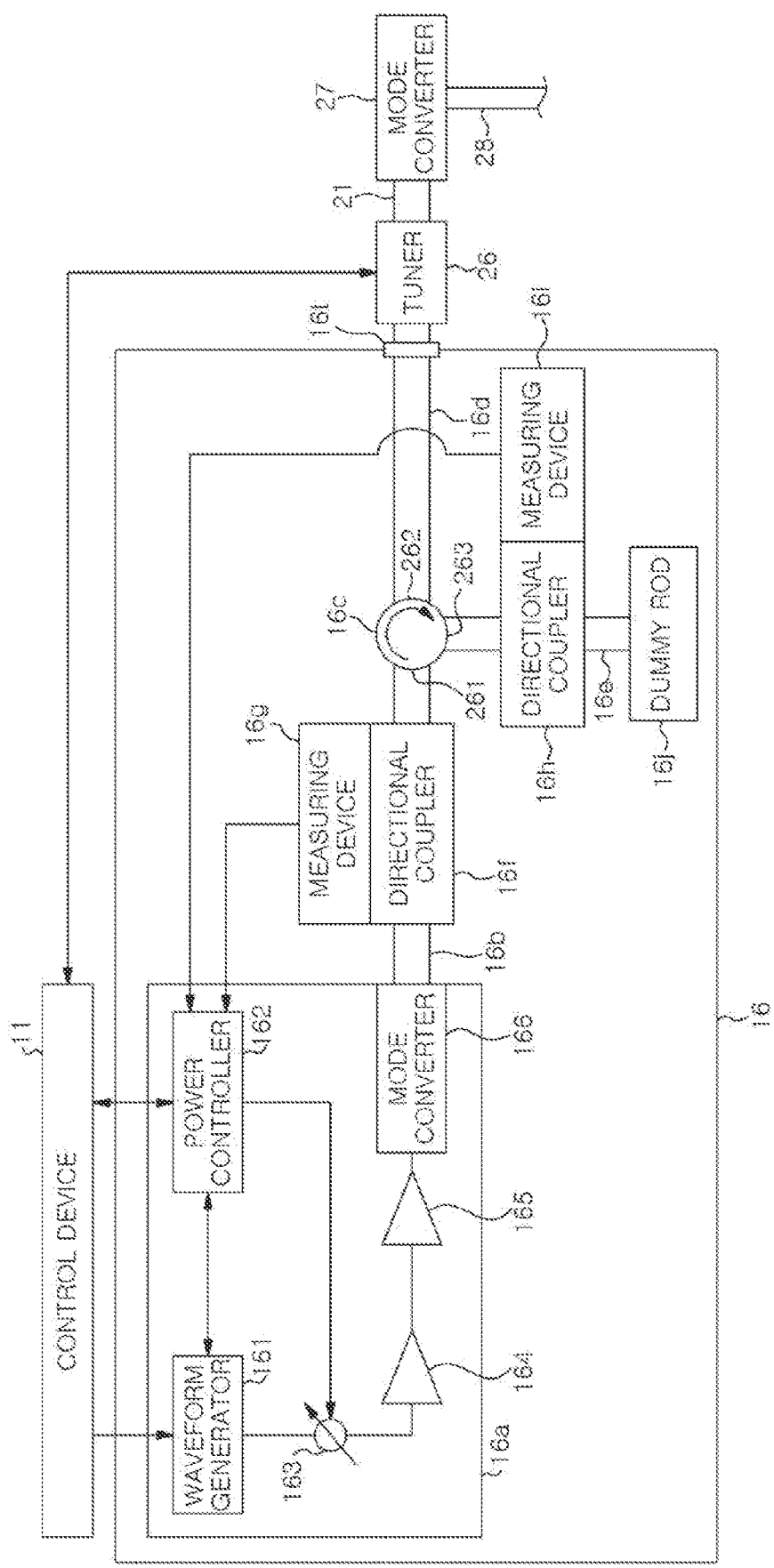
FIG. 2 is a block diagram illustrating one example of a microwave output device.

FIG. 2 is a block diagram illustrating one example of the microwave output device 16. The microwave output device 16 includes a microwave generator 16a, a waveguide 16b, a circulator 16c, a waveguide 16d, a waveguide 16e, a directional coupler 16f, a measuring device 16g, a directional coupler 16h, a measuring device 16i, and a dummy rod 16j. The microwave generator 16a includes a waveform generator 161, a power controller 162, an attenuator 163, an amplifier 164, an amplifier 165, and a mode converter 166.

The waveform generator 161 generates microwaves of a broadband (BB) waveform and a single peak (SP) waveform in a predetermined frequency range (for example, 2.4 GHz to 2.5 GHz). The BB waveform is a waveform having a designated bandwidth at a designated center frequency. The SP waveform is a narrowband waveform having a single peak at a designated bandwidth. Further, the waveform generator 161 may sweep a frequency of the SP waveform from a designated frequency to another designated frequency at a designated sweep speed.

Figure 3:
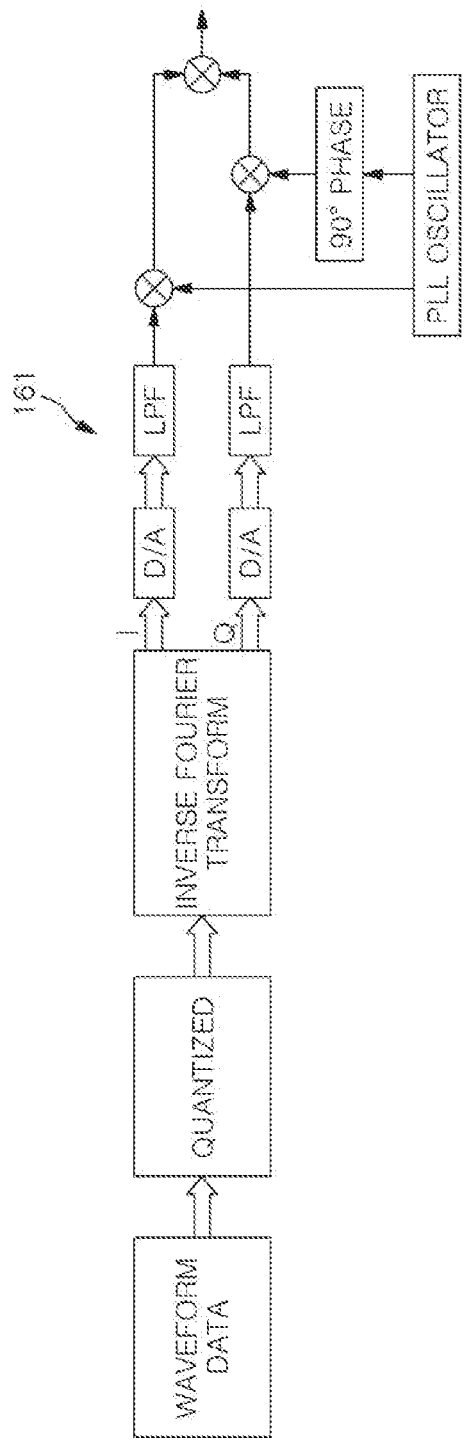
FIG. 3 is a block diagram illustrating one detailed example of a waveform generator.

FIG. 3 is a block diagram illustrating one detailed example of the waveform generator 161. The waveform generator 161 has, for example, a phase locked loop (PLL)

oscillator which outputs microwaves, and an IQ digital modulator connected to the PLL oscillator. The waveform generator 161 sets the frequency of the microwave output from the PLL oscillator to a frequency within a set frequency range designated by the control device 11. Further, the waveform generator 161 modulates the microwave output from the PLL oscillator and a microwave having a phase difference of 90° from the microwave output from the corresponding PLL oscillator using the IQ digital modulator. Accordingly, the waveform generator 161 generates a microwave having a frequency within a set frequency range.

The waveform generator 161 may generate frequency-modulated microwaves by, for example, sequentially inputting N pieces of waveform data from a start frequency to an end frequency according to a scanning speed, quantizing and applying an inverse Fourier transform.

In the embodiment, the waveform generator 161 has waveform data represented by columns of codes which are digitized in advance. The waveform generator 161 quantizes the waveform data and applies an inverse Fourier transform to the quantized data to generate I data and Q data. Further, the waveform generator 161 respectively converts the I data and the Q data, which are digital signals, to analog signals. In addition, the waveform generator 161 extracts a low-frequency component from each converted analog signal by a low pass filter (LPF). In addition, the waveform generator 161 mixes the I component analog signal and the microwave output from the PLL and mixes the Q component analog signal and the microwave with a phase difference of 90° from the microwave output from the PLL. In addition, the waveform generator 161 generates a frequency-modulated microwave by synthesizing the two mixed analog signals.

In addition, a method of generating the microwaves by the waveform generator 161 is not limited to the method exemplified in FIG. 3, and microwaves may also be generated using a direct digital synthesizer (DDS) and a voltage-controlled oscillator (VCO).

Returning to FIG. 2, the description continues. The microwave output from the waveform generator 161 is input to the attenuator 163. The power controller 162 is connected to the attenuator 163. The power controller 162 may be, for example, a processor. The power controller 162 controls an attenuation rate in the attenuator 163 so that the microwave having the power designated by the control device 11 is output from the microwave output device 16. The microwave output from the attenuator 163 is output to the mode converter 166 through the amplifiers 164 and 165. The amplifiers 164 and 165 amplify the microwave at a set amplification rate. The mode converter 166 converts a mode of the microwave amplified by the amplifier 165.

An output end of the microwave generator 16a is connected to one end of the waveguide 16b. The other end of the waveguide 16b is connected to a first port 261 of the circulator 16c. The waveguide 16b is provided with the directional coupler 16f. Further, the directional coupler 16f may be provided in the waveguide 16d. The directional coupler 16f branches a portion of the microwave (that is, a traveling wave) output from the microwave generator 16a and propagating to the circulator 16c to output the portion of the traveling wave to the measuring device 16g. The measuring device 16g measures the power of the traveling wave propagating through the waveguide 16d based on the portion of the traveling wave output from the directional coupler 16f, and outputs a measurement result to the power controller 162.

The circulator 16c has the first port 261, a second port 262, and a third port 263. The circulator 16c outputs the microwave input from the first port 261 to the second port 262, and outputs the microwave input from the second port 262 to the third port 263. One end of the waveguide 16d is connected to the second port 262 of the circulator 16c. An output end 16t of the microwave output device 16 is provided at the other end of the waveguide 16d.

One end of the waveguide 16e is connected to the third port 263 of the circulator 16c, and the dummy rod 16j is connected to the other end of the waveguide 16e. The waveguide 16e is provided with the directional coupler 16h. Further, the directional coupler 16h may be provided in the waveguide 16d. The directional coupler 16h branches a portion of the microwave (that is, a reflected wave) propagating through the waveguide 16e and outputs a portion of the reflected wave to the measuring device 16i. The measuring device 16i measures the power of the reflected wave propagating through the waveguide 16d based on the portion of the reflected wave output from the directional coupler 16h, and outputs a measurement result to the power controller 162.

The dummy rod 16j receives the microwaves propagating through the waveguide 16e and absorbs the microwaves. The dummy rod 16j converts, for example, the microwaves to heat.

The power controller 162 controls the waveform generator 161 and the attenuator 163 such that a difference between the power of the traveling wave measured by the measuring device 16g and the power of the reflected wave measured by the measuring device 16i becomes power designated by the control device 11. The difference between the power of the traveling wave measured by the measuring device 16g and the power of the reflected wave measured by the measuring device 16i is the power supplied to the processing chamber 12.

The tuner 26 is provided in the waveguide 21 and adjusts a protruding position of a movable plate to match the impedance of the microwave output device 16 with the impedance of the processing chamber 12 based on a control signal from the control device 11. The tuner 26 operates the movable plate by a driver circuit and actuator which are not shown. Further, the adjustment of the protruding position of the movable plate may be implemented with a stub structure.

[Frequency Distribution of Power of Reflected Wave]

Figure 4:
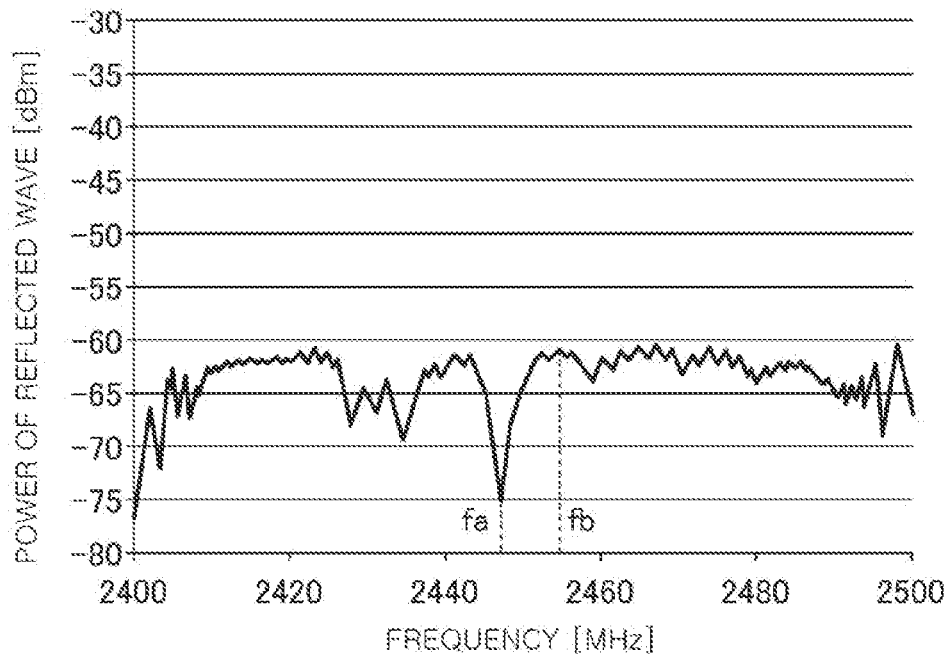
FIG. 4 is a view illustrating one example of a frequency distribution of the power of a reflected wave before plasma is generated.

FIG. 4 is a view illustrating one example of a frequency distribution of the power of the reflected wave before the plasma is generated. FIG. 4 is a plot of the power of the reflected wave for each frequency when the microwave of the SP waveform is supplied into the processing chamber 12 in a state in which no plasma is generated. In an example of FIG. 4, the power of the microwave of the SP waveform supplied into the processing chamber 12 is 30 W.

In the example of FIG. 4, the power of the reflected wave is minimized at a frequency fa. When the microwave of the frequency fa is supplied into the processing chamber 12, the power of the reflected wave may be suppressed to be lower compared to a case in which the microwave of a frequency fb is supplied into the processing chamber 12. Accordingly, when the microwave having the frequency fa is supplied into the processing chamber 12, the power of the microwave may be efficiently supplied into the processing chamber 12, and thus the plasma may be efficiently generated in the processing chamber 12.

However, the impedance in the processing chamber may differ due to the influence of a mechanical difference of the processing chamber 12 (for example, a dimensional error or an assembly error of components). Accordingly, a frequency at which the power of the reflected wave is minimized may be different for each processing chamber 12. Further, even in the same processing chamber 12, a deposition amount of reaction by-products (so-called deposit) in the processing chamber 12 or a consumption amount of consumable components changes as the plasma processing on the substrate WP is repeated. Accordingly, the impedance in the processing chamber 12 changes, and the frequency at which the power of the reflected wave is minimized also changes as the number of times performing plasma processing on the substrate WP increases. Further, when cleaning is performed, since the deposition amount of the deposit changes before and after the cleaning, the impedance in the processing chamber 12 changes, and the frequency at which the power of the reflected wave is minimized also changes.

Accordingly, in the present embodiment, with respect to a plurality of processing chambers 12, the frequency at which the power of the reflected wave is minimized is measured after processing a plurality of substrates WP is performed, after cleaning is performed, or the like. Further, a band including the frequency at which the power of the reflected wave is minimized is previously determined. When the plasma is generated, a microwave of a BB waveform of the determined band is supplied into the processing chamber 12. Accordingly, since power of at least a partial frequency included in the supplied microwave is efficiently supplied into the processing chamber 12, the plasma may be more reliably generated.

Figure 5:
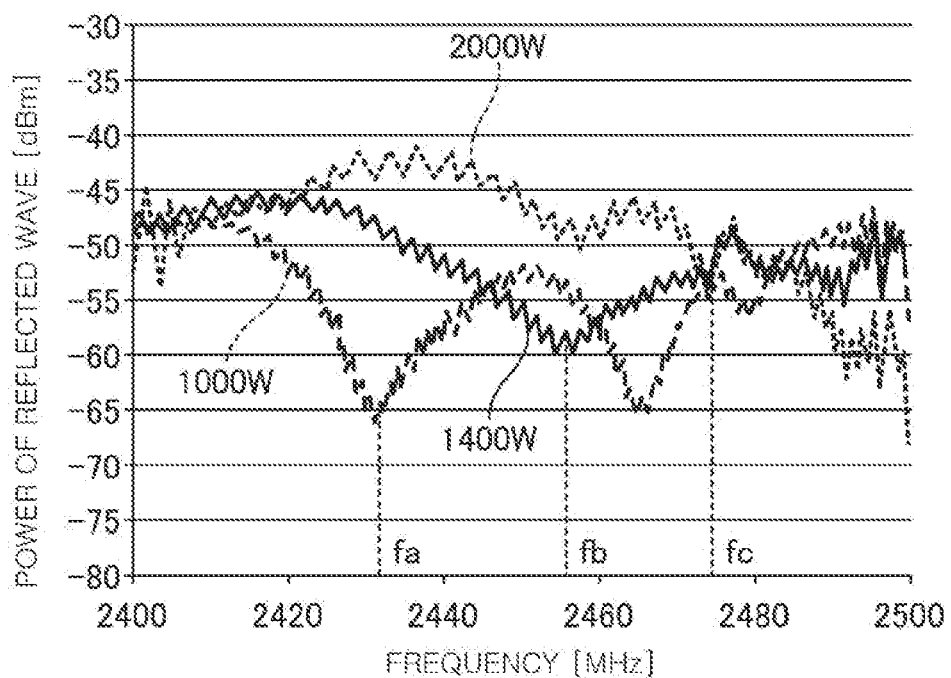
FIG. 5 is a view illustrating one example of a frequency distribution of the power of a reflected wave after the plasma is generated.

FIG. 5 is a view illustrating one example of a frequency distribution of the power of the reflected wave after the plasma is generated. After the plasma is generated, in addition to the state of the processing chamber 12, the frequency at which the power of the reflected wave is minimized changes according to the state of the plasma. For example, as shown in FIG. 5, when the power of the microwaves supplied into the processing chamber 12 is different, the state of the generated plasma changes, and the frequency at which the power of the reflected wave is minimized also changes. In an example in FIG. 5, when the power of the microwave is 1000 W, the power of the reflected wave at the frequency fa is minimized. Further, when the power of the microwave is 1400 W, the power of the reflected wave is minimized at the frequency fb. In addition, when the power of the microwave is 2000 W, the power of the reflected wave is minimized at a frequency fc.

In addition, after the plasma is generated, impedance matching is performed between the output impedance of the microwave output device 16 and the impedance of the load by the tuner 26. In this case, when the power of the reflected wave from the processing chamber 12 is large, it becomes difficult to perform the impedance matching correctly. Accordingly, in the present embodiment, after the plasma is generated, a microwave having a bandwidth smaller than or equal that of the microwave supplied before the plasma is generated is supplied. Accordingly, the impedance matching after the plasma is generated may be performed accurately, and the plasma may be stably maintained.

[Plasma Processing Method]

Figure 6:
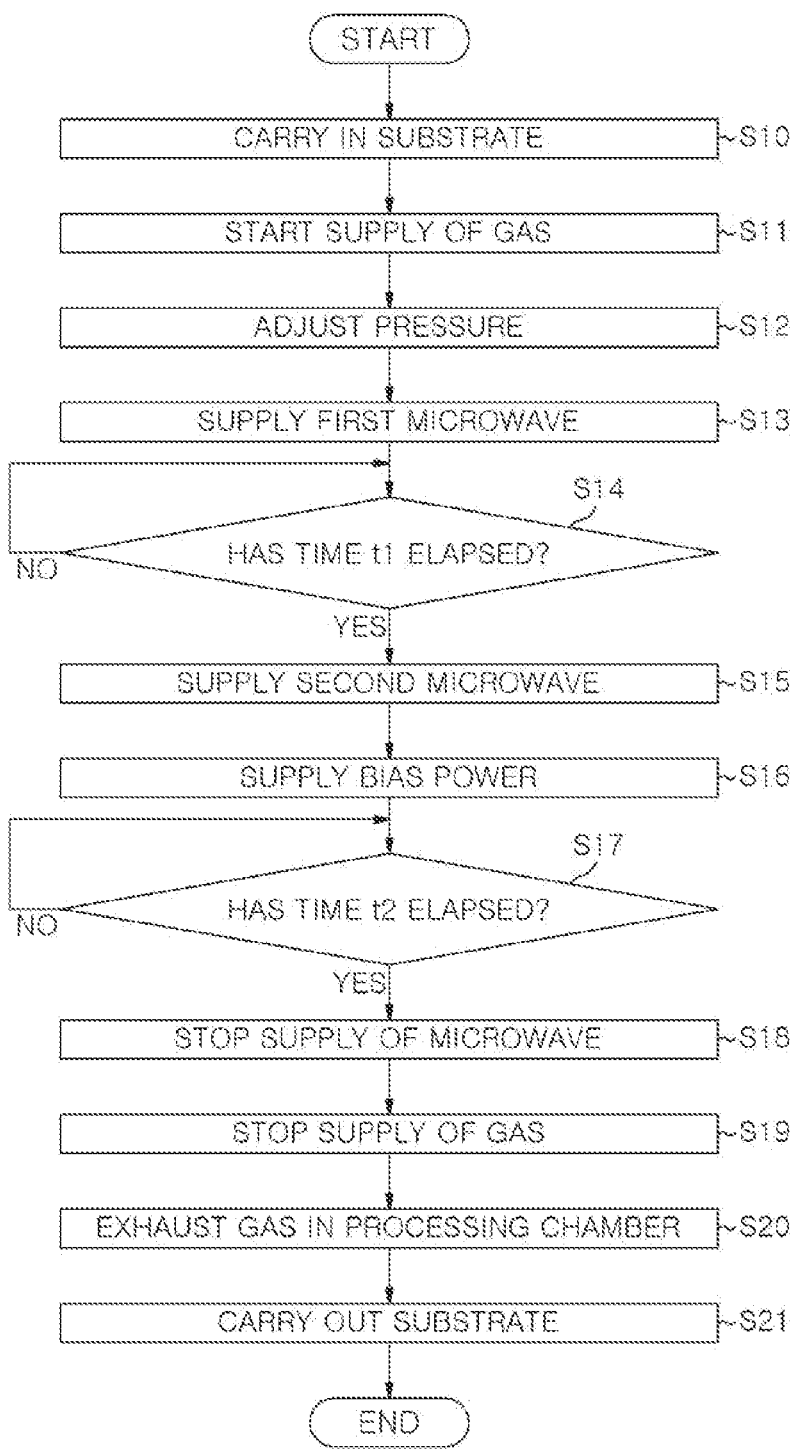
FIG. 6 is a flow chart illustrating one example of a plasma processing method according to a first embodiment.

FIG. 6 is a flow chart illustrating one example of a plasma processing method according to a first embodiment. The processing exemplified in FIG. 6 is realized when a control device 11 controls each part of a device main body 10.

First, a gate valve G is opened, and an unprocessed substrate WP is carried into a processing chamber 12 through an opening 12c by a robot arm (not shown) and mounted on an electrostatic chuck 14c (S10). Then, the gate valve G is closed. Next, the control device 11 opens a valve 38b and controls a flow rate controller 38c so that the processing gas at a predetermined flow rate is supplied into the processing chamber 12, and thus gas supply into the processing chamber 12 starts (S11). Then, the control device 11 controls an exhaust device 56 to adjust a pressure in the processing chamber 12 (S12).

Figure 7A:
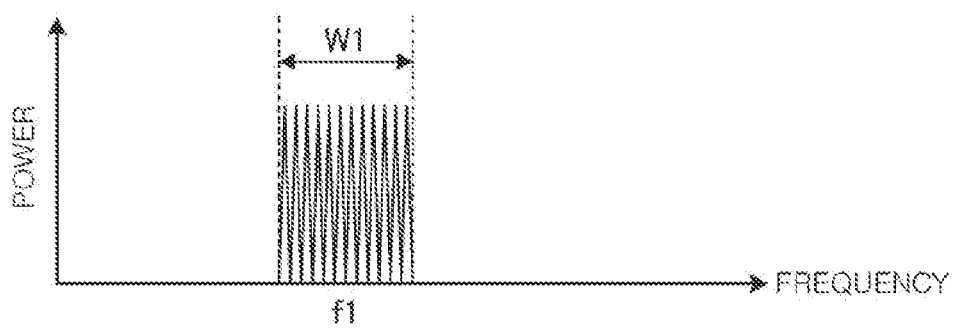
FIG. 7A is a view illustrating one example of a microwave supplied before the plasma is generated.

Subsequently, the control device 11 controls a microwave output device 16 to supply a first microwave to the processing chamber 12 through an antenna 18 (S13). The first microwave is a microwave of a BB waveform having a bandwidth W1 and a center frequency of f1. In the present embodiment, a frequency distribution of the power of a reflected wave is measured with respect to a plurality of processing chambers 12 after processing for a plurality of substrates WP is performed, after cleaning is performed, or the like. Then, the bandwidth W1 and the center frequency f1 are determined so that the frequency at which the power of the reflected wave in each measured frequency distribution is minimized is included in a frequency range of the microwave. Accordingly, in step S13, for example, a microwave having a frequency distribution as shown in FIG. 7A is supplied into the processing chamber 12. The bandwidth W1 is an example of a first bandwidth, and the center frequency f1 is an example of a first frequency (first center frequency). In addition, step S13 is an example of process (a).

Subsequently, the control device 11 determines whether a predetermined time t1 (for example, several tens to hundreds of milliseconds) has elapsed after the supply of the first microwave is started (S14). The time t1 is a time from when the first microwave is supplied until the plasma is generated in the processing chamber 12. When the time t1 has not elapsed (S14: No), the processing shown in step S14 is executed again.

On the other hand, when the time t1 has elapsed (S14: Yes), the control device 11 controls the microwave output device 16 to supply a second microwave to the processing chamber 12 instead of the first microwave (S15). The second microwave is a microwave of a BB waveform having a bandwidth W2 and a center frequency of f2. In the embodiment, the bandwidth W2 is a bandwidth smaller than or equal to the bandwidth W1. Further, in the embodiment, the center frequency f2 is a frequency different from the center frequency f1.

Here, since a state in the processing chamber 12 before the plasma is generated and a state in the processing chamber 12 after the plasma is generated are different, the frequency at which the power of the reflected wave is minimized often becomes different before the plasma is generated and after the plasma is generated. Accordingly, by setting the center frequency f1 of the first microwave supplied before the plasma generation and the center frequency f2 of the second microwave supplied after the plasma generation as different frequencies, the power according to the state in the processing chamber 12 may be supplied into the processing chamber 12. Accordingly, while more reliably generating the plasma, the plasma may be stably maintained.

Figure 7B:
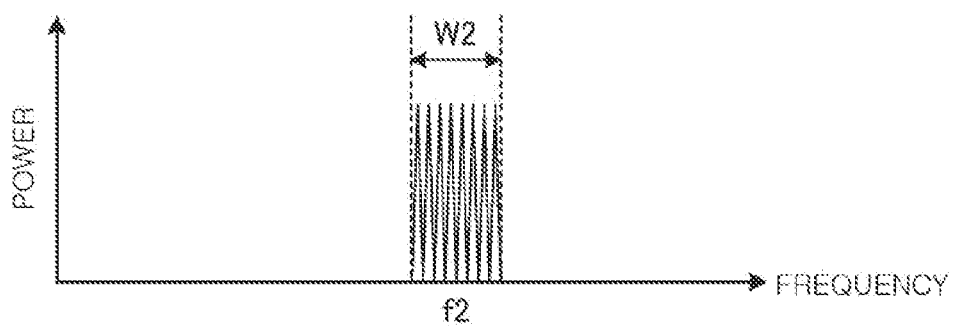
FIG. 7B is a view illustrating one example of a microwave supplied during plasma processing according to the first embodiment.

In the present embodiment, the frequency distribution of the power of the reflected wave is measured for a plurality of processing chambers 12 after processing for a plurality of substrates WP is performed, after cleaning is performed, or the like. Further, the bandwidth W2 and the center frequency f2 are determined so that the frequency at which the power of the reflected wave in each measured frequency distribution is minimized is included in the frequency range of the microwave. Accordingly, in step S15, for example, a microwave having a frequency distribution as shown in FIG. 7B is supplied into the processing chamber 12. The bandwidth W2 is an example of the second bandwidth, and the center frequency f2 is an example of the second frequency (second center frequency). Further, step S15 is an example of process (b).

Subsequently, the control device 11 controls an RF power source 58 to supply bias power to a base 14a via a matcher 60 and a power supply rod 62 (S16). Accordingly, plasma processing, such as etching, or the like, on the substrate WP is started.

Subsequently, the control device 11 determines whether a predetermined time t2 (for example, several seconds to several minutes) has elapsed after the supply of the second microwave is started (S17). The time t2 is a time from when the supply of the second microwave is started until the plasma processing such as etching or the like, on the substrate WP is completed. When the time t2 has not elapsed (S17: No), the processing shown in step S17 is executed again.

On the other hand, when the time t2 has elapsed (S17: Yes), the control device 11 controls the microwave output device 16 to stop supply of the second microwave (S18). Then, the control device 11 closes the valve 38b to stop the supply of the processing gas into the processing chamber 12 (S19). Next, the control device 11 controls the exhaust device 56 to exhaust the processing gas in the processing chamber 12 (S20). Then, the gate valve G is opened, and the processed substrate WP is carried out from the inside of the processing chamber 12 by a robot arm (not shown) (S21). Then, the plasma processing shown in this flowchart is ended.

In the above, the first embodiment has been described. The plasma processing apparatus 1 of the embodiment includes the processing chamber 12, the gas supply 38, the microwave output device 16, and the control device 11. The processing chamber 12 accommodates the substrate WP. The gas supply 38 supplies the processing gas into the processing chamber 12. The microwave output device 16 supplies power to the processing chamber 12 to generate plasma from the processing gas supplied into the processing chamber 12 such that the substrate WP is processed by using the generated plasma. The control device 11 controls the microwave output device 16. Further, the control device 11 controls the microwave output device 16 to perform (a) a process of supplying the power (first power) including a frequency component within the band (first band) having a bandwidth W1 to the processing chamber 12 when the plasma is generated from the processing gas, and (b) a process of supplying the power (second power) including a frequency component within the band (second band) having a bandwidth W2 smaller than or equal to the bandwidth W1 to the processing chamber 12 when the substrate is processed by using the generated plasma. Accordingly, while more reliably generating the plasma, the plasma may be stably maintained.

Further, in the above-described embodiment, when the plasma is generated from the processing gas, the control device 11 controls the microwave output device 16 to supply the power including a frequency component within the band having the bandwidth W1 centered on the frequency f1 to the processing chamber 12. In addition, when the substrate WP is processed by using the generated plasma, the control device 11 controls the microwave output device 16 to supply the power including a frequency component within the band having the bandwidth W2 centered on the frequency f2 different from the frequency f1 to the processing chamber 12. Accordingly, while more reliably generating the plasma, the plasma may be stably maintained.

Second Embodiment

In the first embodiment, the microwave of the BB waveform having the bandwidth W2 centered on the frequency f2 is supplied into the processing chamber 12 during the plasma processing of the substrate WP. In contrast to this, in the present embodiment, a microwave of an SP waveform having the frequency f2 is supplied into the processing chamber 12 during the plasma processing of the substrate WP. Accordingly, since the reflected wave may be reduced, the impedance matching at the time of the plasma processing of the substrate WP may be more precisely performed. Further, since a configuration of the plasma processing apparatus 1 in the present embodiment is the same as the plasma processing apparatus 1 in the first embodiment described using FIGS. 1 to 3, a detailed description thereof will be omitted.

[Plasma Processing Method]

Figure 8:
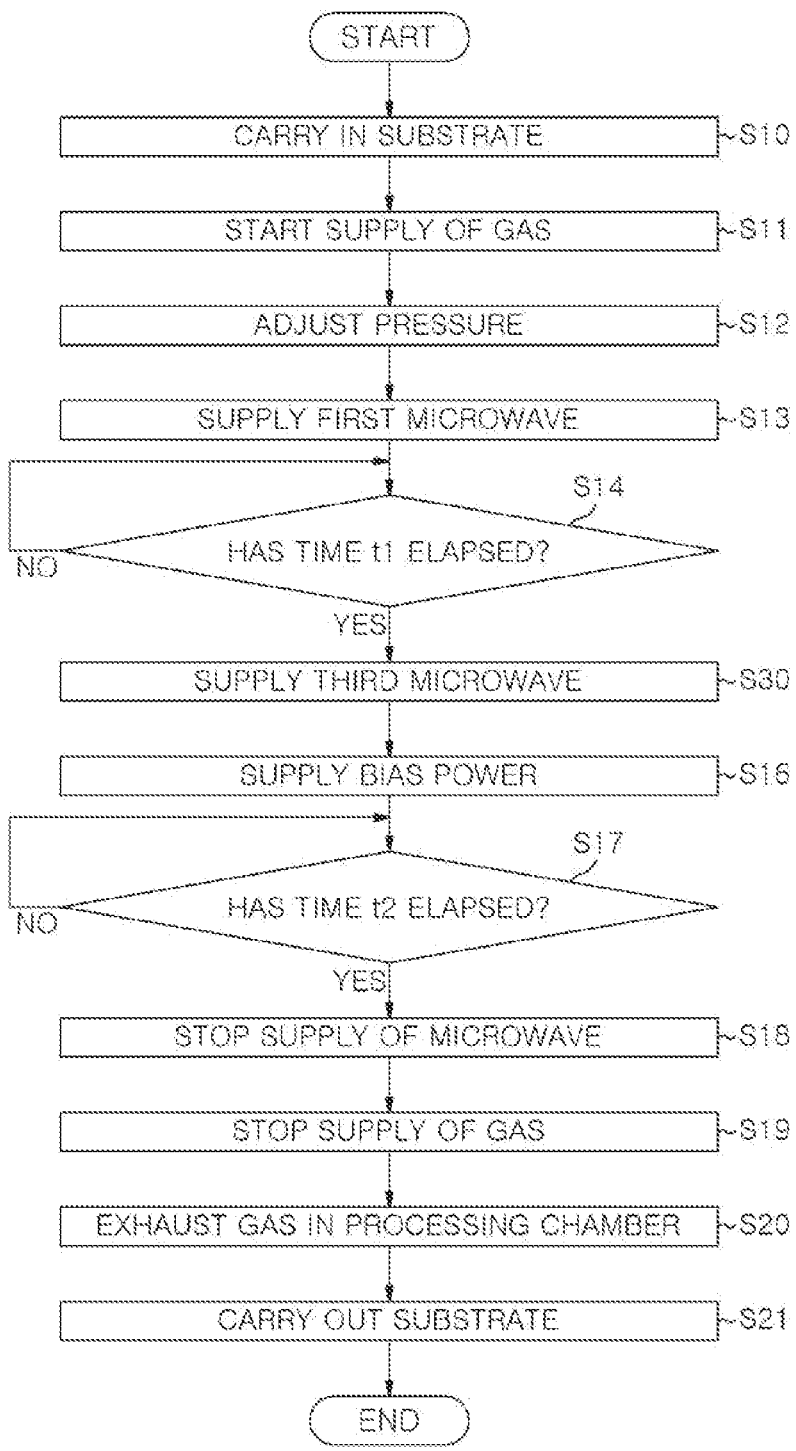
FIG. 8 is a flow chart illustrating one example of a plasma processing method according to a second embodiment.

FIG. 8 is a flow chart illustrating one example of a plasma processing method according to a second embodiment. The processing shown in FIG. 8 is realized when the control device 11 controls each part of the device main body 10. Further, in the processing shown in FIG. 8, except for points to be described below, since processes to which reference numerals the same as FIG. 6 are granted are the same as the processes described using FIG. 6, a detailed description thereof will be omitted.

Figure 9:
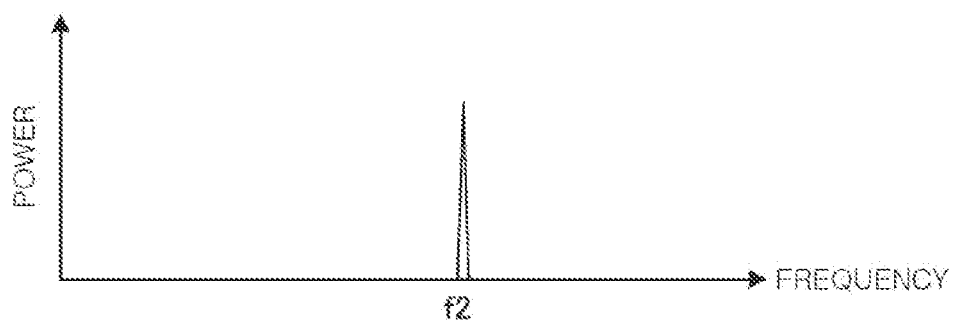
FIG. 9 is a view illustrating one example of a microwave supplied during plasma processing according to the second embodiment.

When it is determined that the predetermined time t1 has elapsed after the supply of the first microwave is started (S14: Yes), the control device 11 controls the microwave output device 16 to supply a third microwave into the processing chamber 12 instead of the first microwave (S30). The third microwave is, for example, a microwave of an SP waveform having a single peak at the frequency f2, as shown in FIG. 9. Next, the processing after step S16 is executed.

In the above, the second embodiment has been described. The plasma processing apparatus 1 according to the present embodiment supplies the microwave of the SP waveform centered on the frequency f2 to the processing chamber 12 after the plasma is generated. Accordingly, since the reflected wave may be reduced, the impedance matching at the time of the plasma processing of the substrate WP may be more precisely performed.

Third Embodiment

In the first embodiment, when the plasma is generated, the microwave of the BB waveform having the bandwidth W1 centered on the frequency f1 is supplied into the processing chamber 12, and after the plasma is generated, the microwave of the BB waveform having the bandwidth W2 centered on the frequency f2 is supplied into the processing chamber 12. In the present embodiment, a microwave of a BB waveform having a bandwidth W3 centered on a frequency f3 is supplied into the processing chamber 12 during a period after the plasma is generated until the plasma processing of the substrate WP is started. The frequency f3 is a frequency between the frequency f1 and the frequency f2, and the bandwidth W3 is a bandwidth between the bandwidth W1 and the bandwidth W2. For example, the bandwidth W3 is smaller than or equal to the bandwidth W1 and larger than or equal to the bandwidth W2. Accordingly, it is possible to suppress plasma misfire caused by abrupt changes in the bandwidth and the center frequency of the microwave supplied into the processing chamber 12. Further, since the configuration of the plasma processing apparatus 1 in the present embodiment is the same as the plasma processing apparatus 1 in the first embodiment described using FIGS. 1 to 3, a detailed description thereof will be omitted.

[Plasma Processing Method]

Figure 10:
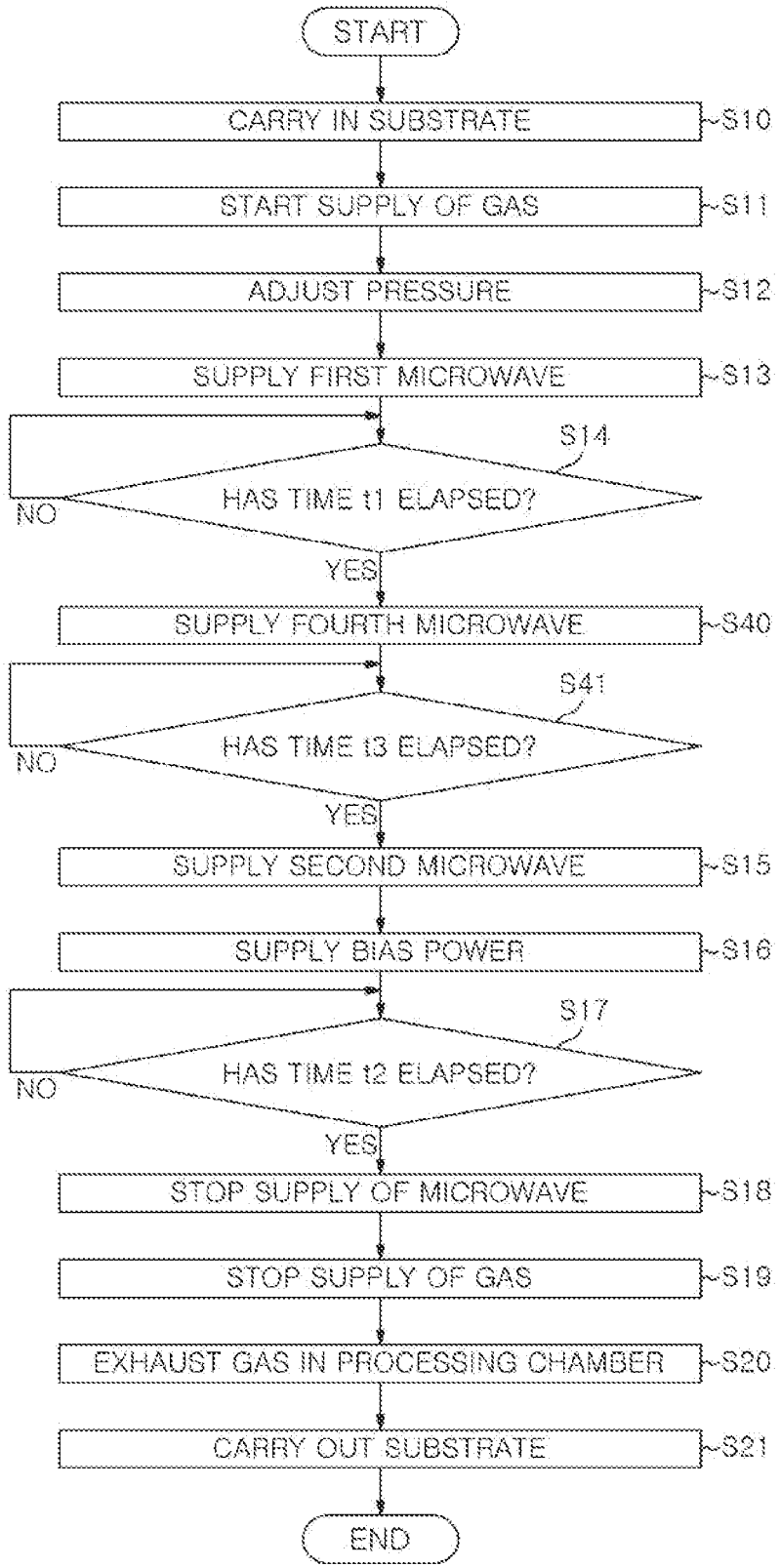
FIG. 10 is a flow chart illustrating one example of a plasma processing method according to a third embodiment.

FIG. 10 is a flow chart illustrating one example of a plasma processing method according to a third embodiment. The processing shown in FIG. 10 is realized when the control device 11 controls each part of the device main body 10. Further, in the processing shown in FIG. 10, except for points to be described below, since processes to which reference numerals the same as FIG. 6 are granted are the same as the processes described using FIG. 6, a detailed description thereof will be omitted.

When it is determined that the predetermined time t1 has elapsed after the supply of the first microwave is started (S14: Yes), the control device 11 controls the microwave output device 16 to supply a fourth microwave into the processing chamber 12 instead of the first microwave (S40). The fourth microwave is, for example, a microwave of the BB waveform having the bandwidth W3 centered on the frequency f3. Then, the control device 11 determines whether a predetermined time t3 (for example, several tens to hundreds of milliseconds) has elapsed after supply of the fourth microwave is started (S41). When the time t3 has not elapsed (S41: No), the processing shown in step S41 is executed again. On the other hand, when the time t3 has elapsed (S41: Yes), the processing shown after step S15 is executed.

Figure 11A:
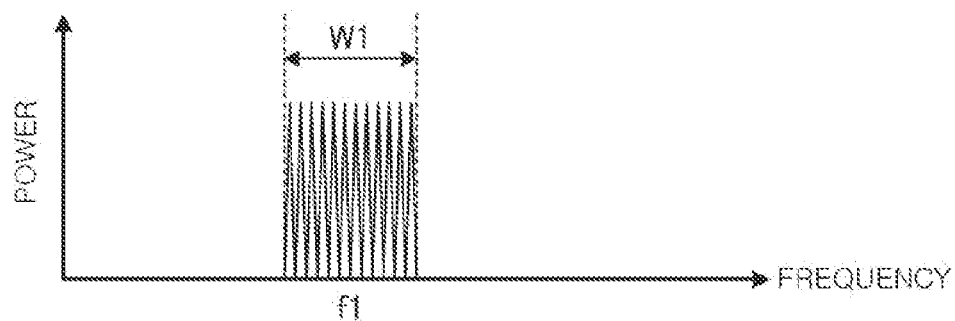
FIG. 11A is a view illustrating one example of a microwave supplied before the plasma is generated.
Figure 11B:
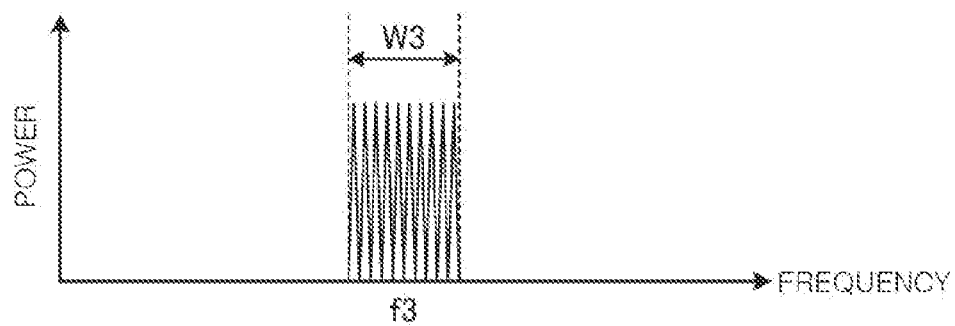
FIG. 11B is a view illustrating one example of a microwave supplied from after the plasma is generated to the start of plasma processing.
Figure 11C:
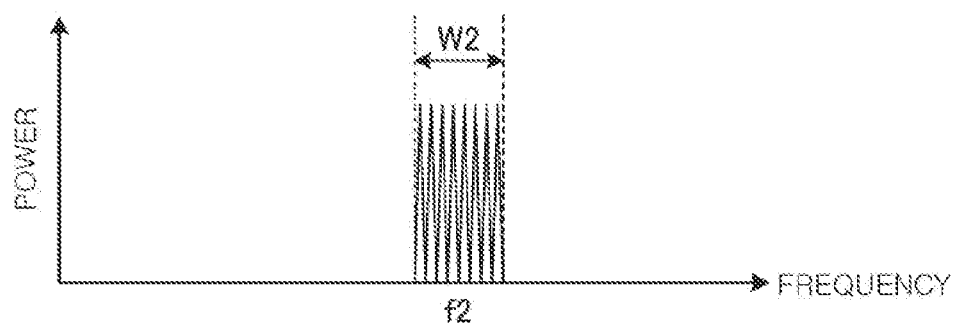
FIG. 11C is a view illustrating one example of a microwave supplied during plasma processing.

In the present embodiment, in step S13, for example, as shown in FIG. 11A, the microwave of the BB waveform having the bandwidth W1 centered on the frequency f1 is supplied into the processing chamber 12. Then, in step S40, for example, as shown in FIG. 11B, the microwave of the BB waveform having the bandwidth W3 centered on the frequency f3 is supplied into the processing chamber 12. Next, in step S15, for example, as shown in FIG. 11C, the microwave of the BB waveform having the bandwidth W2 centered on the frequency f2 is supplied into the processing chamber 12. The frequency f3 is a frequency between the frequency f1 and the frequency f2, and the bandwidth W3 is a bandwidth between the bandwidth W1 and the bandwidth W2. Accordingly, it is possible to suppress plasma misfire caused by the abrupt changes in the bandwidth or the center frequency of the microwave supplied into the processing chamber 12.

In the above, the third embodiment has been described. In the present embodiment, during a period after the plasma is generated from the processing gas and before the processing of the substrate WP using the generated plasma is started, the control device 11 supplies power (third power) including a frequency component included in the band (third band) centered on the frequency f3 (third center frequency) between the frequency f1 and the frequency f2 and having the bandwidth W3 (third bandwidth) which is a bandwidth between the bandwidth W1 and the bandwidth W2 to the processing chamber 12. Accordingly, the generated plasma may be stably maintained.

Fourth Embodiment

In the above-described first to third embodiments, with respect to the plurality of processing chambers 12, the frequency at which the power of the reflected wave is minimized is previously measured after the processing for a plurality of substrates WP is performed, after cleaning is performed, or the like. Further, the frequency band including the frequency at which the power of the reflected wave is minimized is determined, and when plasma is generated, the microwave having the BB waveform of the determined band is supplied into the processing chamber 12. In contrast to this, in the present embodiment, before the plasma is generated, the frequency distribution of the power of the reflected wave is measured by supplying the microwave of the SP waveform into the processing chamber 12 and sweeping the frequency of the microwave. Further, based on the measured frequency distribution of the power of the reflected wave, the bandwidth W1 and the center frequency f1 of the microwave of the BB waveform supplied at the time of plasma generation are determined. Accordingly, the bandwidth W1 and the center frequency f1 are determined according to an environment in the processing chamber 12 when the plasma is generated, and the plasma may be more reliably generated. Further, since the configuration of the plasma processing apparatus 1 in the present embodiment is the same as the plasma processing apparatus 1 in the first embodiment described using FIGS. 1 to 3, a detailed description thereof will be omitted.

[Plasma Processing Method]

Figure 12:
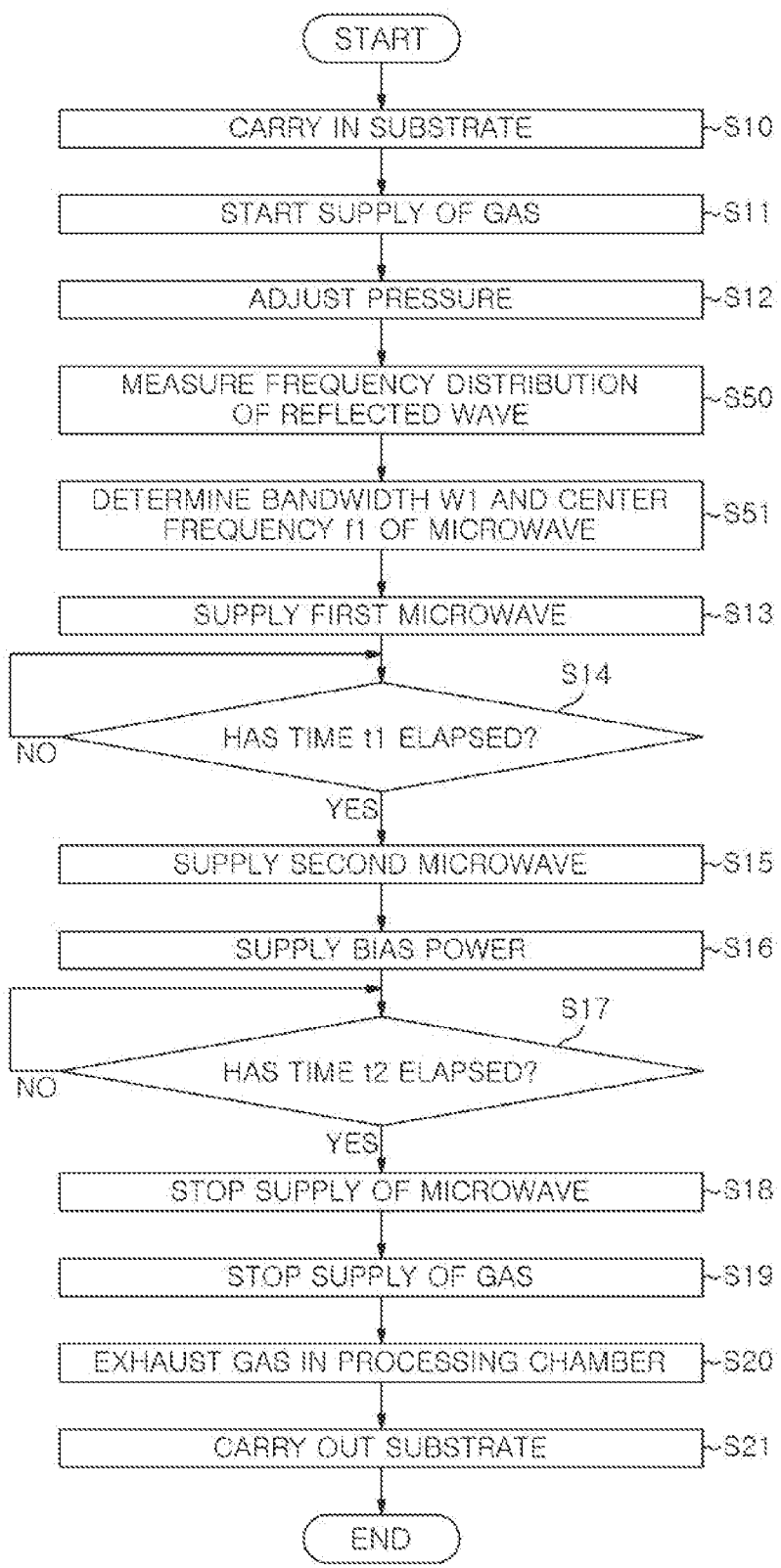
FIG. 12 is a flow chart illustrating one example of a plasma processing method according to a fourth embodiment.

FIG. 12 is a flow chart illustrating one example of a plasma processing method according to a fourth embodiment. The processing shown in FIG. 12 is realized when the control device 11 controls each part of the device main body 10. Further, in the processing shown in FIG. 12, except for points to be described below, since processes to which reference numerals the same as FIG. 6 are granted are the same as the processes described using FIG. 6, a detailed description thereof will be omitted.

After the pressure in the processing chamber 12 is adjusted, the control device 11 controls the microwave output device 16 to supply the microwave of the SP waveform into the processing chamber 12 and sweeps the frequency of the microwave to measure the frequency distribution of the power of the reflected wave (S50). Further, when the frequency distribution of the power of the reflected wave is different according to the magnitude of the supplied power, the frequency distribution of the power of the reflected wave may be measured using the microwave of the SP waveform of the power of the same magnitude as the power supplied when the plasma is generated. Then, the control device 11 determines the center frequency f1 of the microwave of the BB waveform supplied when the plasma is generated based on the measured frequency distribution (S51). Next, the processing shown after step S13 is executed.

Figure 13:
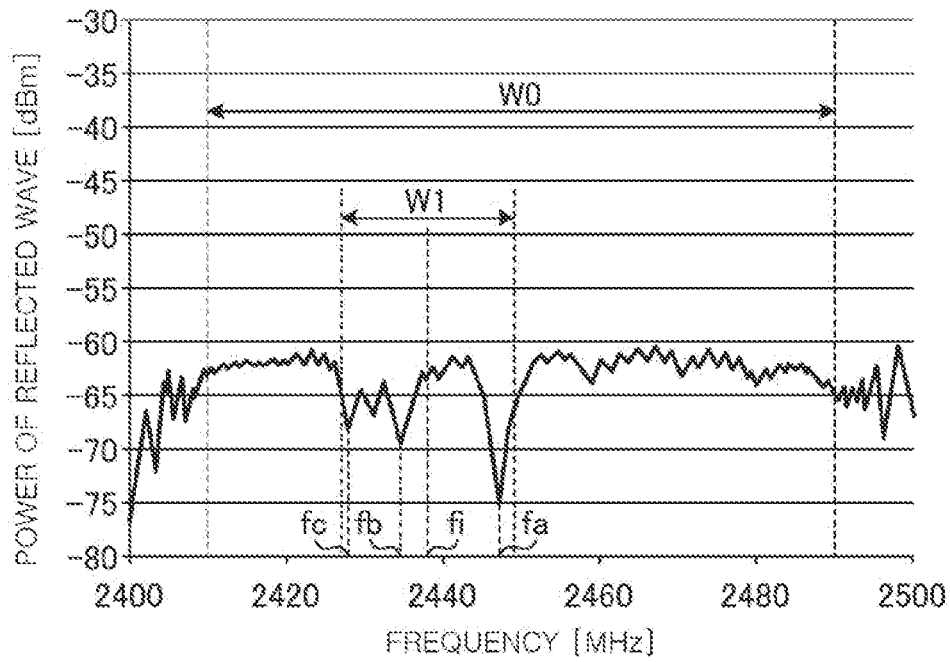
FIG. 13 is a view for describing one example of a method of determining a bandwidth and a center frequency of a microwave before the plasma is generated.

In the present embodiment, in step S50, for example, the frequency distribution of the power of the reflected wave as shown in FIG. 13 is measured. Then, in step S51, in a predetermined band W0 (for example, 2410 MHz to 2490 MHz), a plurality of peaks protruding upward in a direction where the power is low are specified as peaks in which the power of the reflected wave becomes smaller. Then, among the specified plurality of peaks, frequencies corresponding to a predetermined number of peaks in the order of the lower power of the reflected wave are specified. In the example in FIG. 13, three peaks are specified in the order of the lower power of the reflected wave, and the frequency fa, frequency fb, and a frequency fc respectively corresponding to the peaks are specified. Then, for example, as shown in FIG. 13, a bandwidth in a band including all specified frequencies is determined as the bandwidth W1, and a center frequency of the band is determined as the center frequency f1. Accordingly, since the microwave power may be more efficiently supplied into the processing chamber 12 according to the environment in the processing chamber 12 when the plasma is generated, the plasma may be more reliably generated.

Figure 14:
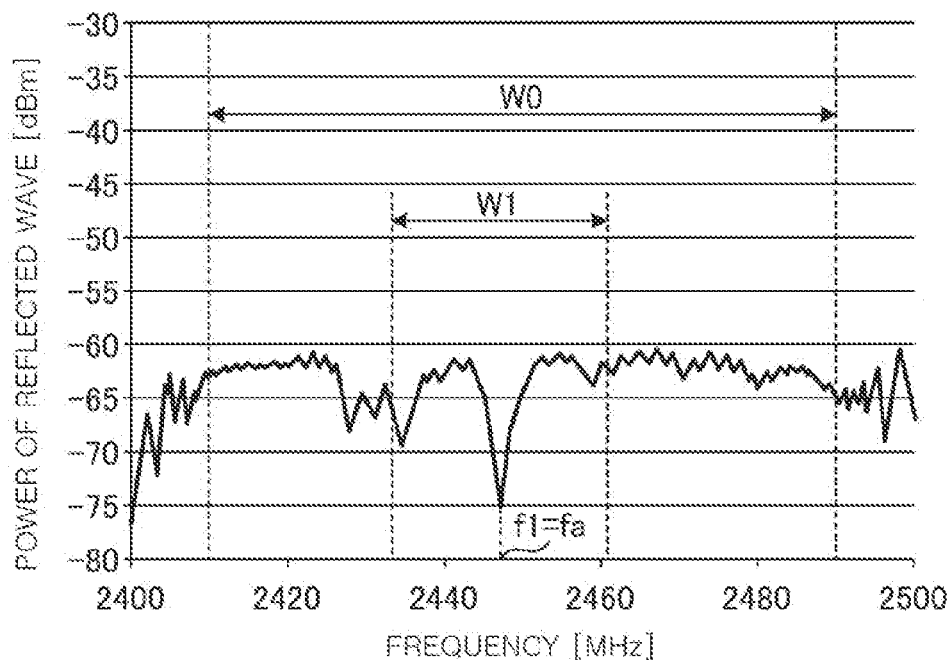
FIG. 14 is a view for describing another example of the method of determining the bandwidth and the center frequency of the microwave before the plasma is generated.

Further, a method of determining the center frequency f1 of the first microwave is not limited to the method shown in FIG. 13. For example, as shown in FIG. 14, the frequency fa at which the power of the reflected wave is minimized may be determined as the center frequency f1. In this case, the bandwidth W1 may be a predetermined bandwidth or may be a bandwidth including all frequencies corresponding to the predetermined number of peaks in the order of the lower power of the reflected wave.

In the above, the fourth embodiment has been described. In the present embodiment, the control device 11 controls the microwave output device 16 to supply the microwave having peak power at a set frequency to the processing chamber 12, and sweep the peak of the frequency to measure the frequency distribution of the power of the reflected wave from the processing chamber 12. Then, the control device 11 determines the bandwidth W1 and the center frequency f1 based on the frequency distribution of the power of the reflected wave. Accordingly, it is possible to more reliably generate the plasma according to the environment in the processing chamber 12 when the plasma is generated.

[Others]

Further, the technology disclosed herein is not limited to the above-described embodiments, and numerous modifications may be performed within the scope of the principle.

For example, in each of the above-described embodiments, the center frequency f1 of the microwave supplied into the processing chamber 12 during plasma generation is different from the center frequency f2 of the microwave supplied into the processing chamber 12 during plasma processing. However, the disclosed technology is not limited to the above, and the center frequency f1 and the center frequency f2 may be the same frequency.

Further, for example, in each of the above-described embodiments, the bandwidth W1 of the microwave supplied into the processing chamber 12 during plasma generation is different from the bandwidth W2 of the microwave supplied into the processing chamber 12 during plasma processing, but the disclosed technology is not limited to the above. As another aspect, the bandwidth W1 and the bandwidth W2 may be the same bandwidth.

Further, for example, in each of the above-described embodiments, although the plasma processing apparatus 1 which performs the processing using the plasma generated using the power of the microwave band frequency is described as an example, the disclosed technology is not limited to the above. As another aspect, the disclosed technology may also be applied to a plasma processing apparatus which performs processing using plasma generated using power having a frequency lower than that of the microwave band. The frequency lower than the frequency of the microwave band is, for example, a frequency of a high frequency (HF) band (3 to 30 MHz).

Further, in the above-described embodiment 3, during a period after the plasma is generated before the plasma processing of the substrate WP is started, the third microwave having a bandwidth between the bandwidth W1 and the bandwidth W2 centered on a frequency between the frequency f1 and the frequency f2 is supplied. However, the disclosed technology is not limited to the above. For example, during the period after when the plasma is generated and before the plasma processing of the substrate WP is started, as time elapses, a microwave of which the center frequency gradually changes from the frequency f1 to the frequency f2 and the bandwidth gradually changes from the bandwidth W1 to the bandwidth W2 may be supplied. In this case, the change of the center frequency and the bandwidth with respect to the time may be a step type and may also be continuous.

Further, in the above-described embodiments, plasma etching processing has been described as an example of the plasma processing, but the disclosed technology is not limited to the above. When the processing is processing using plasma, the disclosed technology may also be applied to, for example, film-forming processing, modification processing, cleaning processing, and the like.

Further, in the above-described embodiments, although the microwave plasma has been used as an example of a plasma source, the disclosed technology is not limited to the above. The plasma source may be, for example, capacitively coupled plasma (CCP), inductively coupled plasma (ICP), or the like.

Further, it should be understood that the embodiments disclosed in this specification are illustrative in all aspects, and not restrictive. Indeed, the above-described embodiments may be implemented in various forms. Further, the above-described embodiments may be omitted, substituted, and changed in various forms, without departing from the scope of the appended claims and the meaning.

The invention claimed is:

1. A plasma processing apparatus comprising:
a processing chamber configured to accommodate a substrate;
a gas supply configured to supply a processing gas into the processing chamber;
a power supply configured to supply power to the processing chamber to generate plasma from the processing gas supplied into the processing chamber such that the substrate is processed by using the generated plasma; and
a control circuit configured to control the power supply,
wherein the control circuit controls the power supply to perform (a) a first process of supplying a first power including a frequency component within a first band having a first bandwidth to the processing chamber, when the plasma is generated from the processing gas, and (b) a process of supplying a second power including a frequency component within a second band having a second bandwidth to the processing chamber, and not supplying the first power, when the substrate is processed by using the generated plasma,
wherein the second bandwidth is smaller than the first bandwidth.

2. The plasma processing apparatus of claim 1, wherein, in the process (b), the control circuit controls the power supply to supply power having a single peak at a predetermined frequency as the second power including the frequency component within the second band having the second bandwidth to the processing chamber.

3. The plasma processing apparatus of claim 1, wherein, in the process (a), the control circuit controls the power supply to supply the first power including a frequency component within the first band having the first bandwidth and a first center frequency to the processing chamber, and
in the process (b), the control circuit controls the power supply to supply the second power including a frequency component within the second band having the second bandwidth and a second center frequency different from the first center frequency to the processing chamber.

4. The plasma processing apparatus of claim 3, wherein the control circuit controls the power supply to supply a third power including a frequency component within a third band having a third bandwidth to the processing chamber during a period after the plasma is generated from the processing gas and before a processing of the substrate by using the generated plasma is started, wherein the third band is centered on a third center frequency between the first center frequency and the second center frequency and the third bandwidth is smaller than or equal to the first bandwidth and larger than or equal to the second bandwidth.

5. The plasma processing apparatus of claim 3, wherein the control circuit controls the power supply to supply power having a single peak at a set frequency to the processing chamber and sweep the single peak of the set frequency to measure a frequency distribution of power of a reflected wave from the processing chamber, and determines the first bandwidth and the first center frequency based on the frequency distribution of the power of the reflected wave.

6. The plasma processing apparatus of claim 4, wherein the control circuit controls the power supply to supply power having a single peak at a set frequency to the processing chamber and sweep the single peak of the set frequency to measure a frequency distribution of power of a reflected wave from the processing chamber, and determines the first bandwidth and the first center frequency based on the frequency distribution of the power of the reflected wave.

7. A plasma processing method as a method of controlling power in a plasma processing apparatus including a processing chamber configured to accommodate a substrate, a gas supply configured to supply a processing gas into the processing chamber, a power supply configured to supply power to the processing chamber to generate plasma from the processing gas supplied into the processing chamber such that the substrate is processed by using the generated plasma, and a control circuit configured to control the power supply and perform the plasma processing method that comprises: (a) a process of supplying a first power including a frequency component within a first band having a first bandwidth to the processing chamber, in response to the plasma being generated from the processing gas; and (b) a process of supplying a second power including a frequency component within a second band having a second bandwidth to the processing chamber, and not supplying the first power, in response to the substrate being processed by using the generated plasma, wherein the second bandwidth is smaller than the first bandwidth.

8. The plasma processing method of claim 7, wherein the process (b) includes supplying power having a single peak at a predetermined frequency as the second power including the frequency component within the second band having the second bandwidth to the processing chamber.

9. The plasma processing method of claim 7, wherein the process (a) includes supplying the first power including a frequency component within the first band having the first bandwidth and a first center frequency to the processing chamber, and the process (b) includes supplying the second power including a frequency component within the second band having the second bandwidth and a second center frequency different from the first center frequency to the processing chamber.

10. The plasma processing method of claim 9, further comprising:

(c) a process of supplying a third power including a frequency component within a third band having a third bandwidth to the processing chamber during a period after the plasma is generated from the processing gas and before a processing of the substrate by using the generated plasma is started, wherein the third band is centered on a third center frequency between the first center frequency and the second center frequency and the third bandwidth is smaller than or equal to the first bandwidth and larger than or equal to the second bandwidth.

11. The plasma processing method of claim 9, further comprising:

supplying power having a single peak at a set frequency to the processing chamber and sweeping the single peak of the set frequency to measure a frequency distribution of power of a reflected wave from the processing chamber; and determining the first bandwidth and the first center frequency based on the frequency distribution of the power of the reflected wave.

12. The plasma processing method of claim 10, further comprising:

supplying power having a single peak at a set frequency to the processing chamber and sweeping the single peak of the set frequency to measure a frequency distribution of power of a reflected wave from the processing chamber; and determining the first bandwidth and the first center frequency based on the frequency distribution of the power of the reflected wave.

* * * * *